(12) United States Patent
Kanai (10) Patent No.: US 6,738,944 B1
(45) Date of Patent: May 18, 2004

(54) DIGITAL DATA RECORDING AND REPRODUCING APPARATUS

(75) Inventor: Hirofumi Kanai, Saitama-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/532,864

(22) Filed: Mar. 22, 2000

(30) Foreign Application Priority Data

Mar. 23, 1999 (JP) .......................................... 11/078391

(51) Int. Cl.$^7$ ............................................. H03M 13/03
(52) U.S. Cl. ....................................................... 714/773
(58) Field of Search ........................................ 714/773

(56) References Cited

U.S. PATENT DOCUMENTS

| | | | | |
|---|---|---|---|---|
| 5,226,145 A | * | 7/1993 | Moronaga et al. | 711/202 |
| 5,376,965 A | * | 12/1994 | Nagasaki et al. | 348/231.4 |
| 5,485,469 A | * | 1/1996 | Suzuki | 714/774 |
| 5,535,356 A | | 7/1996 | Kim et al. | 395/430 |
| 5,546,369 A | * | 8/1996 | Lee et al. | 369/47.18 |
| 5,794,202 A | * | 8/1998 | Kim | 704/270 |
| 5,920,833 A | * | 7/1999 | Dierke | 704/230 |
| 5,925,146 A | * | 7/1999 | Murata et al. | 714/746 |
| 6,076,063 A | * | 6/2000 | Unno et al. | 704/500 |
| 6,084,630 A | * | 7/2000 | Yamagishi et al. | 348/220.1 |

FOREIGN PATENT DOCUMENTS

EP          0 851 423          7/1998

* cited by examiner

Primary Examiner—Stephen M. Baker
(74) Attorney, Agent, or Firm—Oblon, Spivak, McClelland, Maier & Neustadt, P.C.

(57) ABSTRACT

Time series progressing signal data and error correcting data for the data are recorded on a non-volatile memory card 25, and the recorded time series progressing signal data is reproduced after having been error-corrected with the error correcting data. During reproduction, if there is time series progressing signal data uncorrectable with the error correcting data, the time series progressing signal data is reproduced with an uncorrectable data error portion being contained therein, or the uncorrectable data error portion is skipped or muted and an error-free portion following the uncorrectable data error portion is reproduced. Thus, it is possible to reproduce and output the desired file data from the first data to the final data. Accordingly, it is possible to solve the problem that when there appears time series progressing signal data uncorrectable with error correcting data, it becomes impossible to reproduce time series progressing signal data which appears subsequently to the point in time.

2 Claims, 6 Drawing Sheets

RELATED ART

FIG.6A

| | | 0          511 512          527 | |
|---|---|---|---|
| BLOCK 0 | PAGE 0 | DATA REGION (512 BYTES) | REDUNDANT PART (16 BYTES) |
| | PAGE 1 | | |
| | ⋮ | | |
| | PAGE END | | |
| BLOCK 1 | PAGE 0 | | |
| | PAGE 1 | | |
| | ⋮ | | |
| | PAGE END | | |
| ⋮ | ⋮ | ⋮ | ⋮ |
| BLOCK END (1023) | PAGE 0 | | |
| | PAGE 1 | | |
| | ⋮ | | |
| | PAGE END | | |

FIG.6B

DATA REGION

| BYTE | ALL PAGES |
|---|---|
| 0~255 | DATA AREA 1 |
| 256~511 | DATA AREA 2 |

FIG.6C

REDUNDANT PART

| BYTE | ALL PAGES |
|---|---|
| 512~515 | RESERVE AREA |
| 516 | DATA STATUS AREA |
| 517 | BLOCK STATUS AREA |
| 518~519 | BLOCK ADDRESS AREA 1 |
| 520~522 | ECC AREA 2 |
| 523~524 | BLOCK ADDRESS AREA 2 |
| 525~527 | ECC AREA 1 |

DIGITAL DATA RECORDING AND REPRODUCING APPARATUS

BACKGROUND OF THE INVENTION

1. Field of the Invention

The present invention relates to a digital data recording and reproducing apparatus which performs digital encoding compression on various information and records and reproduces the encoding compressed data on and from a non-volatile semiconductor memory card, and more particularly, to a digital data recording and reproducing apparatus which records information data such as a moving image or sound which progresses in a time series manner, on a non-volatile memory card together with error correcting data for the information data, and performs suitable reproduction on information data uncorrectable even with the recorded error correcting data.

2. Description of the Related Art

In recent years, the recording capacities of non-volatile semiconductor memories have been increasing and the recordable amount of data per non-volatile semiconductor memory has been increasing. Non-volatile semiconductor memories having card-like shapes have been developed, and digital still cameras for recording still images and audio recording equipment which use such cards in place of silver-halide film or audio recording magnetic tape have been developed and put into practice.

This type of digital still camera and audio recording equipment converts an analog signal picked up and generated by a photographic camera or a microphone into a digital signal, performs encoding compression on the digital signal to convert the digital signal into data having a predetermined data format, and records the data on the non-volatile semiconductor memory. The non-volatile semiconductor memory has a data storage area divided into plural physical blocks each of which stores a predetermined amount of data, and is capable of managing recording or erasure of data for each of the physical blocks. In general, in order to enable recorded data to be read and edited on computer equipment, the non-volatile semiconductor memory adopts a data format conforming to MS-DOS which is an OS for computer equipment.

A microprocessor converts the encoding compressed recorded data into the data format of MS-DOS and creates management file data relative to the recorded data, and records the corrected encoding compressed recorded data and the management file data on physical blocks of the non-volatile semiconductor memory. Thus, reading and erasure of the recorded data recorded on plural physical blocks are performed by using the management file data.

Figure 5:
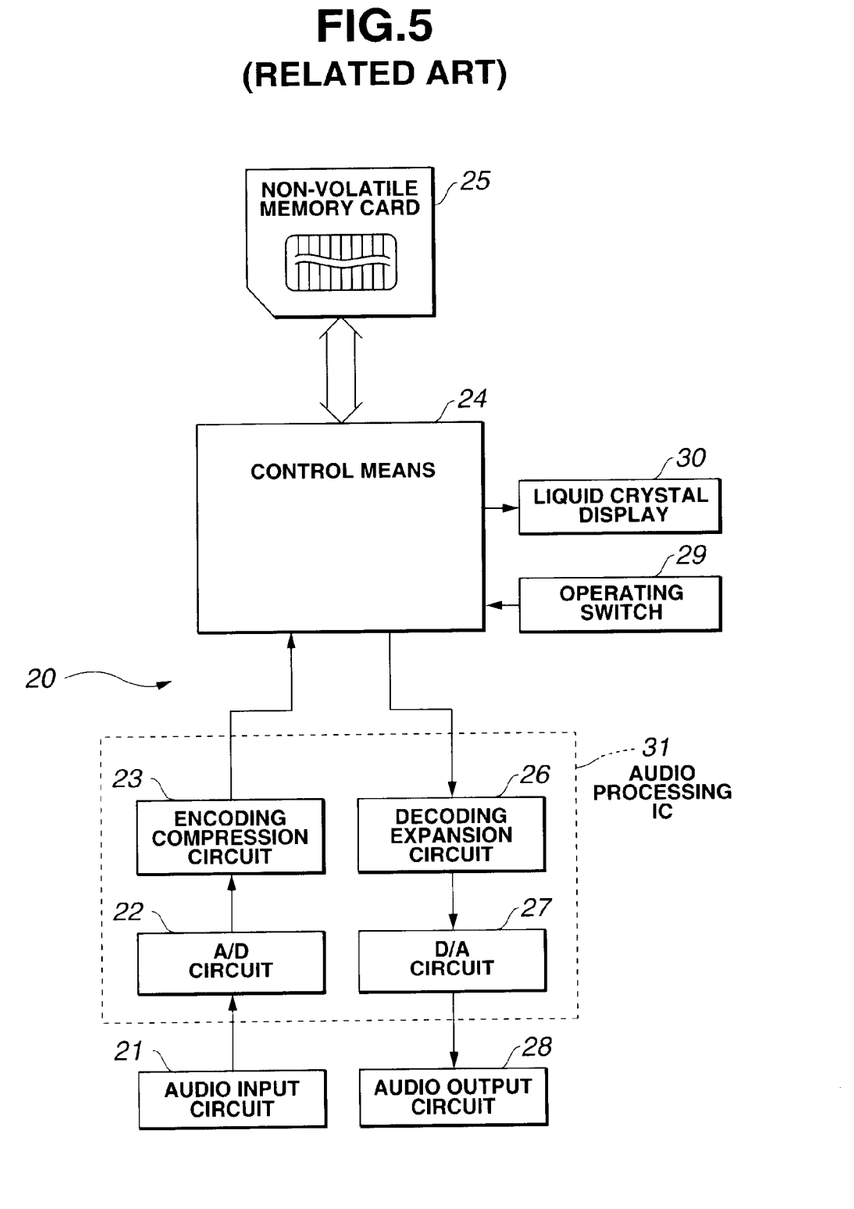
FIG. 5 is a block diagram showing a related art digital data recording and reproducing apparatus.

A specific example of a digital data recording and reproducing apparatus using the non-volatile semiconductor memory will be described below with reference to FIG. 5. FIG. 5 is a block diagram showing the construction of an audio digital data recording and reproducing apparatus.

An audio input circuit 21 of the audio digital data recording and reproducing apparatus 20 shown in FIG. 5 is made of a microphone (not shown) which picks up sound such as music or human voice and generates an analog electrical signal, and an amplifier circuit (not shown) which amplifies the analog audio signal generated by the microphone.

During recording, the analog audio signal generated by the audio input circuit 21 is converted to a digital audio signal by an analog/digital conversion circuit (hereinafter referred to as the A/D circuit) 22, and the digital audio signal is supplied to an encoding compression circuit 23. The encoding compression circuit 23 performs encoding compression on the digital audio signal, thereby generating predetermined digital compressed data. The encoding compression in the encoding compression circuit 23 uses the compression technique of G729A which is an ITU (the International Telecommunications Union) standard. The digital encoding compressed data generated by the encoding compression circuit 23 is recorded on a card provided with a non-volatile semiconductor memory (hereinafter referred to as the non-volatile memory card) 25, via a control means 24 composed of a microprocessor (MPU). As is well known, the microprocessor is also called CPU, and is made of one chip on which are integrated various units such as an arithmetic unit which performs arithmetic and logic operations, a control unit which performs interpretations of instructions and generation of control signals, and a storage unit. The control means 24 exerts control on writing and reading of the digital encoding compressed data to and from the non-volatile memory card 25, and also generates management data on the written digital encoding compressed data.

During reproduction, the digital encoding compressed data read from the non-volatile memory card 25 under the control of the control means 24 is expanded and decoded by a decoding expansion circuit 26, whereby the digital encoding compressed data is converted to a digital audio signal. The digital audio signal generated by the decoding expansion circuit 26 is converted to an analog audio signal by a digital/analog conversion circuit (hereinafter referred to as the D/A circuit) 27, and the analog audio signal is supplied to an audio output circuit 28 which serves as an output end made of an amplifier circuit and a speaker (none of which is shown).

An operating switch 29 and a liquid crystal display 30 are connected to the control means 24. The operating switch 29 serves as an operation input meanswhich has a switch for entering an operation input, such as audio recording, audio reproduction or power-off, into the audio digital data recording and reproducing apparatus 20. The liquid crystal display 30 displays the operating state of the audio digital data recording and reproducing apparatus 20 according to the input from the operating switch 29.

Incidentally, the non-volatile memory card 25 is capable of being removably fitted into a card slot provided in the body (not shown) of the audio digital data recording and reproducing apparatus 20.

The A/D circuit 22, the encoding compression circuit 23, the decoding expansion circuit 26 and the D/A circuit 27 are formed as a one-chip audio processing integrated circuit (hereinafter referred to as the audio processing IC).

Figure 6A:
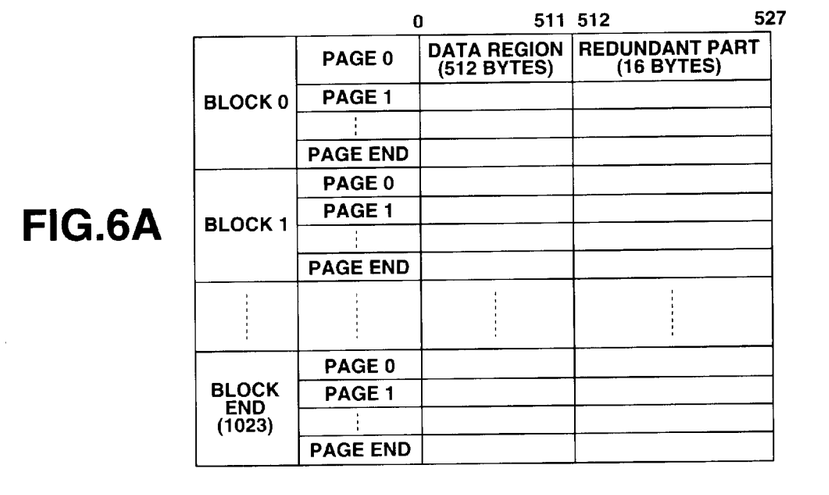
FIGS. 6A to 6C are explanatory diagrams illustrating the problems of the related art digital data recording and reproducing apparatus.

If the non-volatile memory 25 used in the audio digital data recording and reproducing apparatus 20 has a recording capacity of, for example, 8 Mbytes, the data recording area of the non-volatile memory 25 is managed in the state of being divided into 1,024 physical blocks (8 Kbytes per physical block) as shown in FIG. 6A. Each of the physical blocks is managed in the state of being divided into plural pages (page 0 to page end) (in the case of 8 Mbytes, one physical block is divided into sixteen pages 0 to 15).

Figure 6B:
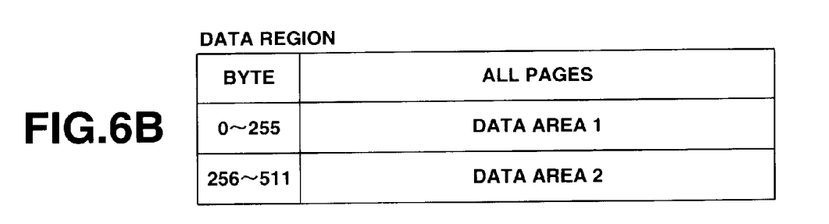
Figure 6C:
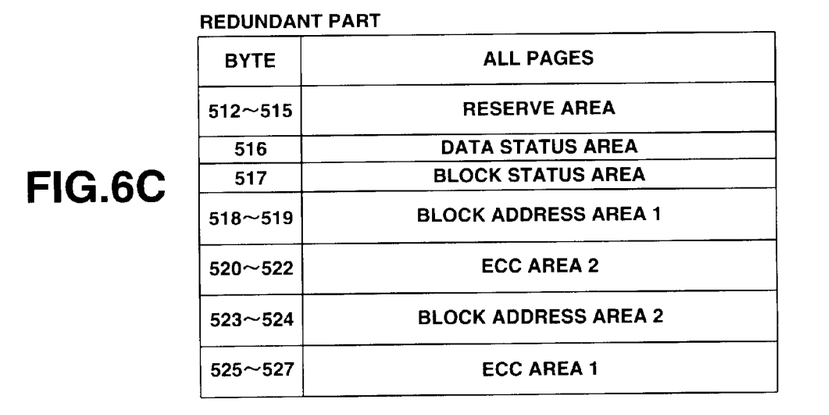

As shown in FIG. 6A, each of the pages of the physical blocks of the non-volatile memory card 25 has a data area of 512 bytes and a redundant part of 16 bytes. As shown in FIG. 6B, the data area includes a data area 1 made of 256 bytes 0 to 255 and a data area 2 made of 256 bytes 256 to 511. As shown in FIG. 6C, the 16 bytes of the redundant part include bytes 512 to 515 assigned to a reserve area, byte 516 assigned to a data status area, byte 517 assigned to a block status area, bytes 518 to 519 assigned to a block address area 1, bytes 520 to 522 assigned to an error correcting data area (hereinafter referred to as ECC area) 2, bytes 523 to 524 assigned to a block address area 2, and bytes 525 to 527 assigned to an ECC area 1. The data area 1 and the data area 2 correspond to the ECC area 1 and the ECC area 2, respectively.

When the audio digital data recording and reproducing apparatus 20 is to record digital encoding compressed data on the non-volatile memory card 25 having such data recording areas, an analog audio signal inputted from the audio input circuit 21 is encoding-compressed and converted into digital encoding compressed data by the audio processing IC 31, and the control means 24 executes control so that the digital encoding compressed data is recorded on the data area of each page of physical blocks of the recording area of the non-volatile memory card 25. At the same time, the control means 24 generates redundant part data relative to the digital encoding compressed data recorded on the data area, and records the redundant part data on the redundant part of the same page.

On the other hand, when the audio digital data recording and reproducing apparatus 20 is to read and reproduce data recorded on the non-volatile memory card 25, the control means 24 reads the data recorded on the non-volatile memory card 25, in the page order of each of the physical blocks, and makes a check as to the presence or absence of an error in the data of the data area of each page by using the data of the ECC area of the redundant part. If there is an error in the data of the data area, the error is corrected with the data of the ECC area. The data of a data area having no error or error-corrected data is decoded and expanded by the audio processing IC 31 and outputted via the audio output circuit 28.

However, the error correcting data recorded in the ECC area of each page of each physical block of the non-volatile memory card 25 is basically set so that error correction is performed on the data recorded in the data area of the same page, but the data recorded in the data area do not always have error contents which are completely correctable with the error correcting data.

If the data error of the data area of a page cannot be corrected with the data of the ECC area of the redundant part of the same page, the control means 24 repeatedly reads the same page having the data error, so that the control means 24 cannot read and reproduce the data of pages following the page having the data error.

As described above, in the related-art digital data recording and reproducing apparatus which records digital encoding compressed data on a non-volatile memory card on the basis of information continuously progressing in a time series manner, and which reads, decodes and expands the digital encoding compressed data recorded on the non-volatile memory card and provides a reproduced output, the digital encoding compressed data are recorded on the non-volatile memory card together with error correcting data for the digital encoding compressed data, and the digital encoding compressed data is error-corrected with the error correcting data. However, if the digital encoding compressed data contains an error uncorrectable with the error correcting data, the related art apparatus operates to perform error correction while repeatedly reading the data of a recording area in which the uncorrectable error data is recorded. This leads to the problem that the related art apparatus becomes unable to read and reproduce digital encoding compressed data subsequently to the recording area which contains the error, and becomes incapable of reproducing the recorded digital encoding compressed data.

SUMMARY OF THE INVENTION

The invention aims to provide a digital data recording and reproducing apparatus in which during reproduction of digital encoding compressed data recorded on a non-volatile memory card, even if there appears digital encoding compressed data containing an error uncorrectable with error correcting data, it is possible to read and reproduce data following the digital encoding compressed data having the uncorrectable error.

The invention provides a digital data recording and reproducing apparatus which comprises: a recording and reproduction control means for executing exchange of digital encoding compressed data between a digital encoding compression means which converts analog information which consecutively progresses in a time series manner into digital encoding compressed data as well as a digital decoding expansion means which decodes and expands the digital encoding compressed data and a non-volatile memory card on which to record digital encoding compressed data, and recording the digital encoding compressed data in a predetermined area of the non-volatile memory card and also reading digital encoding compressed data from the non-volatile memory card; a digital data writing control means for, during recording of the digital encoding compressed data generated by the digital encoding compression means, generating error correcting data for the digital encoding compressed data and also converting the digital encoding compressed data and the error correcting data into a predetermined format of file data, and writing the predetermined format of file data into a predetermined recording area of the non-volatile memory card, the digital data writing control means being provided in the recording and reproduction control means; a digital data decoding control means for, during reproduction of file data recorded on the non-volatile memory card, executing control to read the file data, perform error correcting processing on the digital encoding compressed data on the basis of error correcting data contained in the file data, decode and expand the digital encoding compressed data after the error correction processing by means of the digital decoding expansion means irrespective of whether the error correcting processing determines that the digital encoding compressed data contains no error or the digital encoding compressed data is error-corrected by the error correcting processing, convert the decoded and expanded digital data into an analog signal, and output the analog signal, the digital data decoding control means being provided in the recording and reproduction control means; and an output means for outputting consecutively in a time series manner the analog signal into which the decoded and expanded digital signal is converted.

According to the first aspect of the invention in the above-described digital data recording and reproducing apparatus, during recording of digital encoding compressed data generated by the digital encoding compression means, error correcting data for the digital encoding compressed data is generated, and the digital encoding compressed data and the error correcting data are converted into a predetermined format of file data and written into a predetermined recording area of the non-volatile memory card. During reproduction of the file data written to the non-volatile memory card, the file data is read out, and error correction is performed on the digital encoding compressed data on the basis of the error correcting data contained in the file data. The digital encoding compressed data after the error correction processing is decoded and expanded by means of the digital decoding expansion means irrespective of whether the digital encoding compressed data contains no error or is error-corrected. Accordingly, during reproduction of digital encoding compressed data recorded on the non-volatile memory card, even if there appears digital encoding compressed data containing an error uncorrectable with the error correcting data, the uncorrectable digital encoding compressed data is decoded, expanded and reproduced on "as-is" basis without being repeatedly read out, and data other than the uncorrectable data can be correctly read out and reproduced.

According to the second aspect of the invention, in the above-described digital data recording and reproducing apparatus of the first aspect of the invention, the digital data writing control means generates the digital encoding compressed data and the error correcting data in units of recording pages of a recording area of the non-volatile memory card, and converts the digital encoding compressed data and the error correcting data into the predetermined format file data, whereas the digital data decoding control means executes control to read the file data in units of the recording pages, perform error correction on the digital encoding compressed data on the basis of the reproduced error correcting data, decode and expand the digital encoding compressed data after the error correction processing by means of the digital decoding expansion means irrespective of whether the digital encoding compressed data contains no error or the digital encoding compressed data is error-corrected, convert the decoded and expanded digital encoding compressed data into an analog signal, and output the analog signal.

According to the second aspect of the invention in the above-described digital data recording and reproducing apparatus, the recording of the file data on the non-volatile memory card and the reproduction of the file data from the non-volatile memory card are performed in units of pages which are physically divided in the non-volatile memory card, and the error correction of reproduced digital encoding compressed data is also performed in units of pages.

In addition, during the reproduction, the error correction of the digital encoding compressed data is performed on the basis of reproduced error correcting data, and the digital encoding compressed data after the error correction processing is decoded and expanded by means of the digital decoding expansion means irrespective of whether the digital encoding compressed data contains no error or is error-corrected. Accordingly, even if there appears digital encoding compressed data containing an error uncorrectable with the error correcting data, the uncorrectable data page is not repeatedly read out and the digital encoding compressed data is decoded, expanded and reproduced on "as-is" basis, but data other than the uncorrectable data can be correctly read and reproduced. Since the uncorrectable page is decoded and expanded in small units like units of pages and a meaningless sound is only reproduced for a small period in units of pages, a user does not easily notice the meaningless sound based on the error data and can infer the contents of the meaningless sound on the basis of sounds which precede and succeed the meaningless sound.

According to the third aspect of the invention, the above-described digital data recording and reproducing apparatus according to the first aspect further comprises a muting means for controlling an operation of the output means, the digital data decoding control means executing control to cause the muting means to inhibit the output means from outputting the analog information when the digital encoding compressed data contains error data which cannot be corrected by the error correcting processing.

According to the third aspect of the invention, in the above-described digital data recording and reproducing apparatus, during reproduction, if the digital encoding compressed data contains uncorrectable error data, the muting means provided for the output means which outputs analog information inhibits the output means from outputting the analog information.

The fourth aspect of the invention also provides a digital data recording and reproducing apparatus which comprises: a recording and reproduction control means for executing exchange of digital encoding compressed data between a digital encoding compression means which converts analog information which consecutively progresses in a time series manner into digital encoding compressed data as well as a digital decoding expansion means which decodes and expands the digital encoding compressed data and a non-volatile memory card on which to record digital encoding compressed data, and recording the digital encoding compressed data in a predetermined area of the non-volatile memory card and also reading digital encoding compressed data from the non-volatile memory card; a digital data writing control means for, during recording of the digital encoding compressed data generated by the digital encoding compression means, generating error correcting data for the digital encoding compressed data and also converting the digital encoding compressed data and the error correcting data into a predetermined format of file data, and writing the predetermined format of file data into a predetermined recording area of the non-volatile memory card, the digital data writing control means being provided in the recording and reproduction control means; a digital data decoding control means for, during reproduction of file data recorded on the non-volatile memory card, executing control to read the file data, perform error correcting processing on the digital encoding compressed data on the basis of error correcting data contained in the file data, decode and expand by means of the digital decoding expansion means the digital encoding compressed data which is regarded as having no error in the error correcting processing or is error-corrected by the error correcting processing, processing of the digital encoding compressing data being skipped if the digital encoding compressed data contains data uncorrectable with the error correcting processing, convert the decoded and expanded digital data into an analog signal, and output the analog signal, the digital data decoding control meansbeing provided in the recording and reproduction control means; and an output means for outputting consecutively in a time series manner the analog signal into which the decoded and expanded digital signal is converted.

According to the fourth aspect of the above-described digital data recording and reproducing apparatus, during recording of digital encoding compressed data generated by the digital encoding compression means, error correcting data for the digital encoding compressed data is generated, and the digital encoding compressed data and the error correcting data are converted into a predetermined format of file data and written into a predetermined recording area of the non-volatile memory card. During reproduction of the file data written to the non-volatile memory card, the file data is read out, and error correction is performed on the digital encoding compressed data on the basis of the error correcting data contained in the file data. If the digital encoding compressed data contains an uncorrectable error, such digital encoding compressing data is skipped, but the digital encoding compressed data which contains no error or is error-corrected is decoded and expanded by means of the digital decoding expansion means. Accordingly, during reproduction of digital encoding compressed data recorded on the non-volatile memory card, even if there appears digital encoding compressed data containing an error uncorrectable with error correcting data, the uncorrectable digital encoding compressed data is skipped without being repeatedly read out, whereby data other than the uncorrectable data can be correctly read out and reproduced. Moreover, since the uncorrectable data is skipped, a meaningless sound is not reproduced.

According to the fifth aspect of the invention in the above-described digital data recording and reproducing apparatus according to the fourth aspect, the digital data writing control means generates the digital encoding compressed data and the error correcting data in units of recording pages of a recording area of the non-volatile memory card, and converts the digital encoding compressed data and the error correcting data into the predetermined format file data, whereas the digital data decoding control means executes control to read the file data in units of the recording pages, perform error correction on the digital encoding compressed data on the basis of the reproduced error correcting data, decode and expand by means of the digital decoding expansion means only a page of the digital encoding compressed data which is regarded as having no error in the error correcting processing or is error-corrected by the error correcting processing, the page of the digital encoding compressing data being skipped if the page of the digital encoding compressed data contains data uncorrectable with the error correcting processing, convert the decoded and expanded digital encoding compressed data into an analog signal, and output the analog signal.

According to the fifth aspect of the invention in the above-described digital data recording and reproducing apparatus, the recording of the file data on the non-volatile memory card and the reproduction of the file data from the non-volatile memory card are performed in units of pages which are physically divided in the non-volatile memory card, and the error correction of reproduced digital encoding compressed data is also performed in units of pages.

In addition, during the reproduction, the error correction of the digital encoding compressed data is performed on the basis of reproduced error correcting data, and a page which contains uncorrectable data error is skipped, and the digital encoding compressed data of only a page which contains no error or is error-corrected is decoded and expanded by means of the digital decoding expansion means. Accordingly, even if there appears digital encoding compressed data containing an error uncorrectable with error correcting data, the uncorrectable data page is skipped without being repeatedly read out, but data other than the uncorrectable data can be correctly read and reproduced. Since the uncorrectable data is skipped in small units like units of pages, a user does not easily notice the lack of the skipped portion and can infer the contents of the skipped portion on the basis of sounds which precede and succeed the skipped portion.

DETAILED DESCRIPTION OF THE PREFERRED EMBODIMENTS

Figure 1:
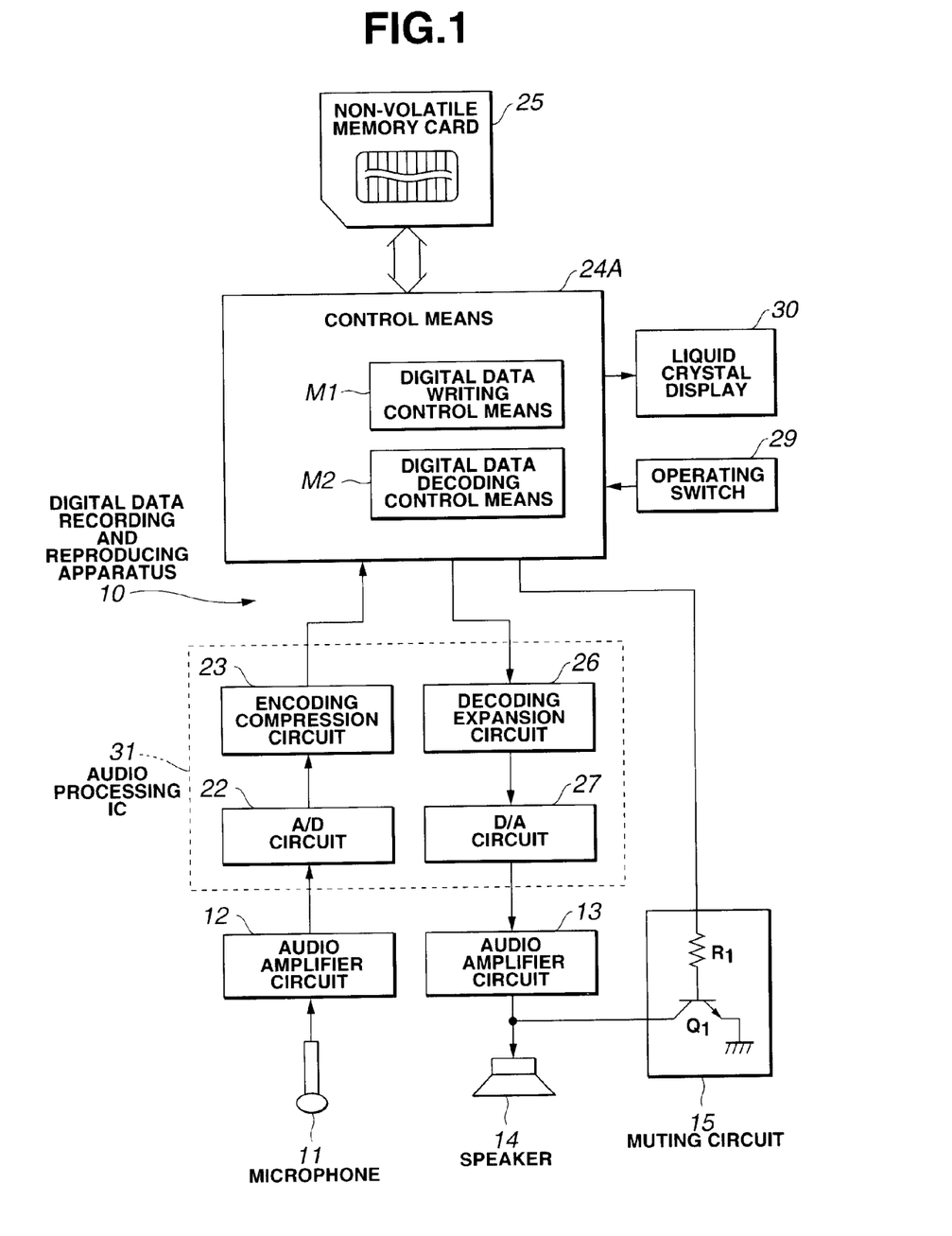
FIG. 1 is a block diagram showing a digital data recording and reproducing apparatus according to one embodiment of the invention.

Preferred embodiments of the present invention will be described below in detail with reference to the accompanying drawings. FIG. 1 is a block diagram showing a digital data recording and reproducing apparatus according to one embodiment of the invention. In FIG. 1, identical reference numerals are used to denote parts identical to those shown in FIG. 5, and the detailed description of the identical parts is omitted.

The digital data recording and reproducing apparatus 10 shown in FIG. 1 differs from the apparatus shown in FIG. 5 in that a recording and reproduction control means (hereinafter referred to simply as the control means) 24A composed of a microprocessor (MPU) which controls the exchange of data between an audio processing IC 31 and a non-volatile memory card 25 is provided with a program which executes processing for realizing the function of digital data writing control means M1 which will be described later, and a program which executes processing for realizing the function of digital data decoding control means M2 which will be described later. In addition, an audio amplifier circuit 12 which amplifies an audio signal supplied from a microphone 11 is connected to an A/D circuit 22 of an audio processing IC 31, and an audio amplifier circuit 13 which amplifies a D/A-converted analog audio signal and a speaker 14 are connected to a D/A circuit 27. Moreover, a muting circuit 15 is connected to the point of connection between the audio amplifier circuit 13 and the speaker 14. The muting circuit 15 mutes an analog audio signal to be supplied to the speaker 14, on the basis of a control signal supplied from the control means 24A. Incidentally, the control means 24A may be composed of a circuit having the same function as that of the microprocessor. The audio amplifier circuit 13 and the speaker 14 compose an output means. The muting circuit 15, for example, is composed of a transistor Q1 which is turned on/off by means of the control signal and a base resistor R1 for supplying the control signal from the control means 24A to a base of the transistor Q1. When the transistor Q1 is turned on by means of the control signal, the output terminal of the audio amplifier circuit 13 is short-circuited to a reference potential point (ground), so that the output supplied from the audio amplifier circuit 13 to the speaker 14 can be stopped.

The other construction is identical to that shown in FIG. 5.

The recording and reproducing operations of the apparatus shown in FIG. 1 will be described below.

First of all, the recording (audio recording) operation will be described. If a recording mode is set on an operating switch 29, the sound picked up by the microphone 11 is converted to an analog audio signal, and the analog audio signal is amplified to a predetermined audio signal by the audio amplifier circuit 12 and the predetermined audio signal is supplied to the A/D circuit 22 of the audio processing IC 31. Then, the predetermined audio signal is converted to a digital signal by the A/D circuit 22, and the digital signal is converted to a predetermined encoding compressed data by an encoding compression circuit 23, and the predetermined encoding compressed data is supplied to the control means 24A. The control means 24A, through the digital data writing control means M1, converts the encoding compressed data into a data structure recordable on a non-volatile memory card 25 and generates error correcting data, and records the digital encoding compressed data and the error correcting data in a data area and a redundant part, respectively, for each page in the physical blocks of the recording area of the non-volatile memory card 25.

The reproducing operation will be described below. If a signal for setting a recording mode is inputted through the operating switch 29 and a data file name to be reproduced is inputted, the data recorded on each page of physical blocks of the non-volatile memory card 25 is read out by the digital data decoding control means M2 of the control means 24A. The digital data decoding control means M2 reads the data recorded on each page of the physical blocks of the non-volatile memory card 25, compares the digital encoding compressed data of the data area of the read page of the physical blocks with the data of the ECC area of the redundant part of the same page, and makes a check as to the presence or absence of error data in the digital encoding compressed data. If there is error data, the control means 24A performs error correction on the digital encoding compressed data on the basis of error correcting data. The digital encoding compressed data of each page of the physical blocks which has been subjected to the error check and error-corrected on the basis of the result of the error check is supplied to the decoding expansion circuit 26 of the audio processing IC 31, in which the digital encoding compressed data is decoded, expanded and converted into a digital signal. At this time, the digital data decoding control means M2 of the control means 24A generates and supplies a control signal which turns off the muting circuit 11.

The digital signal decoded and expanded by the decoding expansion circuit 27 is converted into an analog signal by the D/A circuit 27, and the audio signal is amplified to a predetermined level by the audio amplifier circuit 13 and is outputted from the speaker 14 as a reproduced sound.

A processing operation to be executed when digital encoding compressed data read from the non-volatile memory card 25 contains an error which cannot be corrected even with the error correcting data by the digital data decoding control means M2 of the control means 24A will be described below with reference to the flowchart shown in FIG. 2.

If a signal which sets a reproduction mode is inputted from the operating switch 29 of the digital data recording and reproducing apparatus 10 and a data file name to be reproduced is inputted, the control means 24A, in Step S1, prepares for the processing operation of (i.e., initializes) the digital data decoding control means M2. In Step S2, the control means 24A determines whether the input from the operating switch 29 is the reproduction mode. When the control means 24A confirms in Step S2 that the input is the reproduction mode, the control means 24A reads, in Step S3, the data of the first page of the first physical block of the digital encoding compressed data identified by the data file name and recorded on the non-volatile memory card 25. In Step S4, the control means 24A compares the digital encoding compressed data of the data area of the page read in Step S3 with the error correcting data recorded in the ECC area of the redundant part of the same page, and makes a check as to the presence or absence of error data. If there is error data, the control means 24A performs error correction on the basis of the error correcting data. As the result of the check and the error correction of Step S4, if the digital encoding compressed data of the data area contains an error which cannot be corrected with the error correcting data of the ECC area of the redundant part of the page (this decision is hereinafter referred to simply as "ECC check NG"), the process proceeds to Step S5, in which the control means 24A generates a control signal which turns off the operation of the muting circuit 11, and supplies the control signal to the muting circuit 15. Then, in Step S6, the control means 24A supplies to the decoding expansion circuit 26 of the audio processing IC 31 the digital encoding compressed data of the page on which the decision of "ECC check NG" has been made in Step S4. At this time, the digital encoding compressed data supplied to the decoding expansion circuit 26 contains the uncorrectable data. The decoding expansion circuit 26 decodes and expands the digital encoding compressed data supplied with the error data contained therein, thereby generating a digital signal. The digital signal is converted to an analog signal by the D/A circuit 27, and the audio signal is outputted from the speaker 14 via the audio amplifier circuit 13. That is to say, in Step S6, if the error data cannot be corrected even with, for example, a predetermined number of repetitions of the reading of the data of the same page, the error data is decoded and expanded on "as-is" basis, and after the obtained error data has been sent to the D/A circuit 27, the process proceeds to the operation of reading the data of the next page.

In other words, supplied to the speaker 14 is a sound which is generated on the basis of data including the error data as well as the digital encoding compressed data of the data area of the page on which the decision of "ECC check NG" has been made in Step S4. In addition, since the operation of the muting circuit 15 is turned off in Step S5, a sound due to an audio signal generated from the data containing the error data is outputted from the speaker 14 without being subjected to muting processing.

On the other hand, as the result of the ECC check of Step S4, if the digital encoding compressed data of the data area does not contains an error or is error-corrected with the error correcting data of the ECC area of the redundant part (this decision is hereinafter referred to simply as "ECC check OK"), the process proceeds to Step S7, in which the control means 24A generates a control signal which turns off the operation of the muting circuit 15, and supplies the control signal to the muting circuit 15. Then, in Step S8, the control means 24A supplies to the decoding expansion circuit 26 of the audio processing IC 31 the digital encoding compressed data of the page on which the decision of "ECC check OK" has been made in Step S4. The decoding expansion circuit 26 decodes and expands the digital encoding compressed data, thereby generating a digital signal. The digital signal is converted to an analog signal by the D/A circuit 27, and the audio signal is outputted from the speaker 14 via the audio amplifier circuit 13.

That is to say, since the operation of the muting circuit 15 is turned off in Step S7, the digital encoding compressed data on which the decision of "ECC check OK" has been made in Step S4 is decoded by the decoding expansion circuit 26 and is outputted from the speaker 14 as a sound free of error.

Then, after Step S6 or S8 has been completed, the control means 24A, in Step S9, determines whether the reading and the ECC check of all pages have been completed for each of the physical blocks of the file data to be reproduced or an input for setting a stop mode has been received from the operating switch 29. If there is no input for the stop mode or there remain pages, the process returns to Step S3, in which the data of the next page is similarly subjected to an ECC check, and the above-described processing is repeatedly executed in accordance with the decision of the ECC check.

In other words, even if data which cannot be error-corrected is contained in a page of a physical block of the recording area of the non-volatile memory card, the audio contents of the page are reproduced together with the error data which cannot be error-corrected, so that the audio contents of the page containing the error data which cannot be error-corrected are outputted as an indiscernible sound. However, error-free data or error-corrected data of pages following the page containing the error data which cannot be error-corrected are decoded, expanded and consecutively reproduced as sound.

In the above-described case, it is to be noted that the audio contents of the page containing the error data which cannot be corrected are outputted as an indiscernible sound, but if the audio data of the page is temporally short, the reproduced sound will not be annoying.

That is to say, the data area per unit page is, as described previously, prescribed to have, for example, 512 bytes, but during reproduction, error correction of the data recorded in the data area of each page is performed in units of pages by use of the data of the redundant part of the same page. Accordingly, if the size of audio data to be recorded on the data area per page (512 bytes) is made small (i.e., the audio recording time per page is made short), even page data having an uncorrectable error is reproduced as a sound of short time, so that a user does not easily notice the error.

For example, if the non-volatile memory card 25 has a storage capacity of 8 Mbytes, the amount of recordable data per page of each of the physical blocks is about 0.5 seconds in the case of the data of an audio signal which continuously progresses in a time series manner. However, if the storage capacity of the non-volatile memory card 25 is larger than 8 Mbytes, the number of pages per physical block increases, and moreover the operating speeds of the control means 24A, the non-volatile memory card 25 and the like increases, therefore even if the recordable time of audio data per page (512 Mbytes) is made short, the total amount of data recordable over all pages does not decrease. In other words, even if the recording time per page is made short, the total audio recording time of the recording and reproducing apparatus using the non-volatile memory card 25 does not decrease, owing to the recent increase in the storage capacity of the non-volatile memory card 25.

Accordingly, even in the case of the non-volatile memory card 25 of 8 Mbytes, a meaningless sound of 0.5 seconds is outputted from a page containing an uncorrectable error data, but since audio reproduction of pages following the page containing the uncorrectable error data can be consecutively performed, a user can infer or understand the contents of the meaningless sound on the basis of sounds which precede and succeed the meaningless sound. In addition, since the reproduction time per page, as described above, can be reduced by making short the recording time (recording quantity) per page, it is possible to reproduce sounds following the meaningless sound without allowing the user to notice the meaningless sound, whereby it is possible to achieve smooth audio reproduction.

Another embodiment of the digital data decoding control means M2 of the control means 24A of the digital data recording and reproducing apparatus 10 according to the invention will be described below with reference to the flowchart of FIG. 3.

Figure 2:
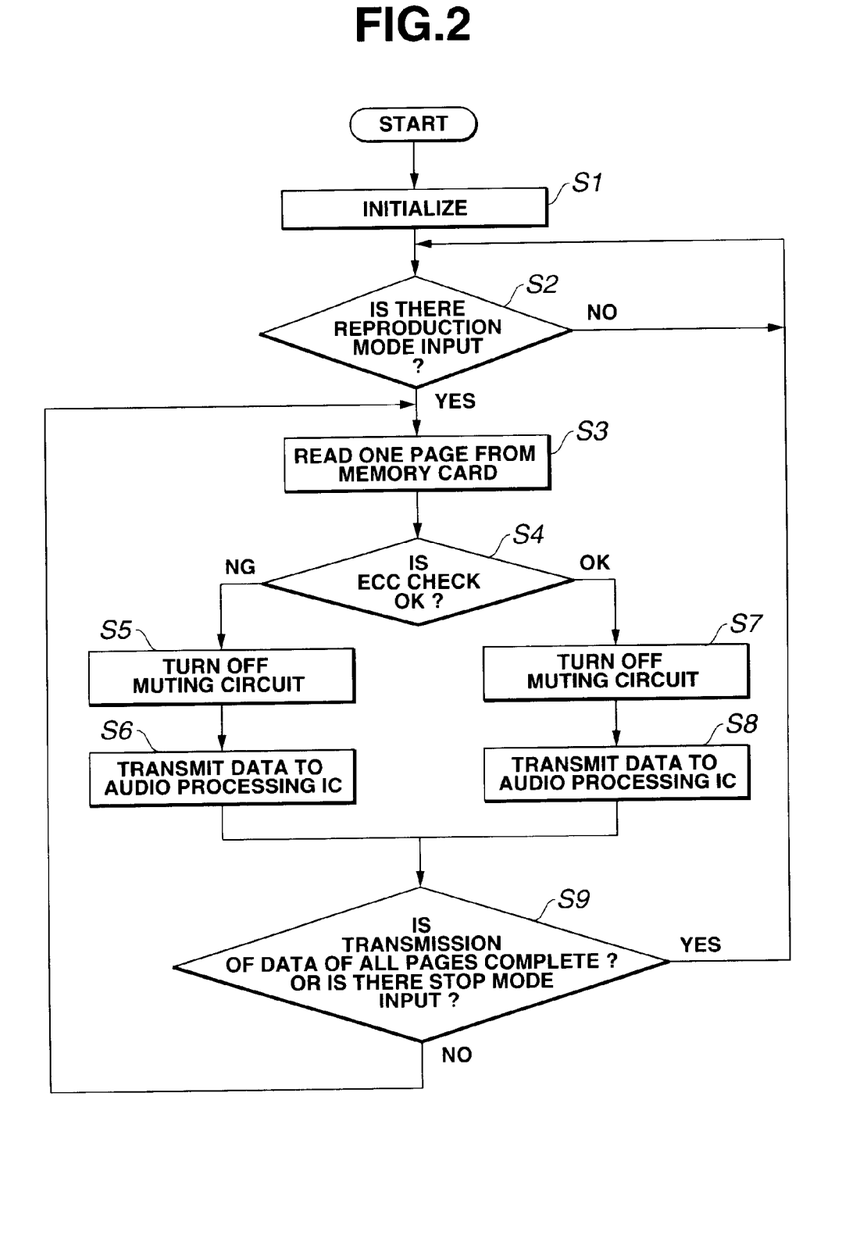
FIG. 2 is a flowchart illustrating the operation of the digital data recording and reproducing apparatus according to the invention.

The processing operations of Steps S11 to S14 of this embodiment are identical to those of Steps S1 to S4 of FIG. 2. If the decision of "ECC check NG" is made in the ECC check of Step S14, the process proceeds to Step S17, in which the control means 24A determines whether the reading of the data of all the pages has been completed, without performing the processing of decoding and expanding the digital encoding compressed data of the data area of the page on which the decision of "ECC check NG" has been made in Step S14. If the reading of the data of all the pages has not yet been completed, the process returns to Step S13, in which the control means 24A reads the digital encoding compressed data of the next page. Subsequently, the control means 24A repeats the processing operations of Steps S14 to S17 to process the read digital encoding compressed data. On the other hand, if the decision of "ECC check OK" has been made in Step S14, the control means 24A, in Step S15, generates a control signal which turns off the operation of the muting circuit 15 and supplies the control signal to the muting circuit 15. In Step S16, the decoding expansion circuit 26 of the audio processing IC 31 decodes and expands the digital encoding compressed data, and the D/A circuit 27 converts the decoded and expanded digital data into an analog signal. After that, the analog signal is outputted as a sound from the speaker 14 via the audio amplifier circuit 13.

In other words, the processing operation of the above-described embodiment is such that error correction is performed for each page of the physical blocks of the non-volatile memory card 25 and a page containing an uncorrectable data error is skipped without being decoded nor expanded, and the data of the next page that does not need error correction or is error-corrected is decoded and expanded to be outputted as a reproduced sound.

Thus, the page having the uncorrectable data error is skipped and is not outputted as a reproduced sound, but the data recorded on pages following the page having the uncorrectable data error can be outputted as a reproduced sound.

Yet another embodiment of the digital data decoding control means M2 of the control means 24A of the digital data recording and reproducing apparatus 10 according to the invention will be described below with reference to the flowchart of FIG. 4.

Figure 4:
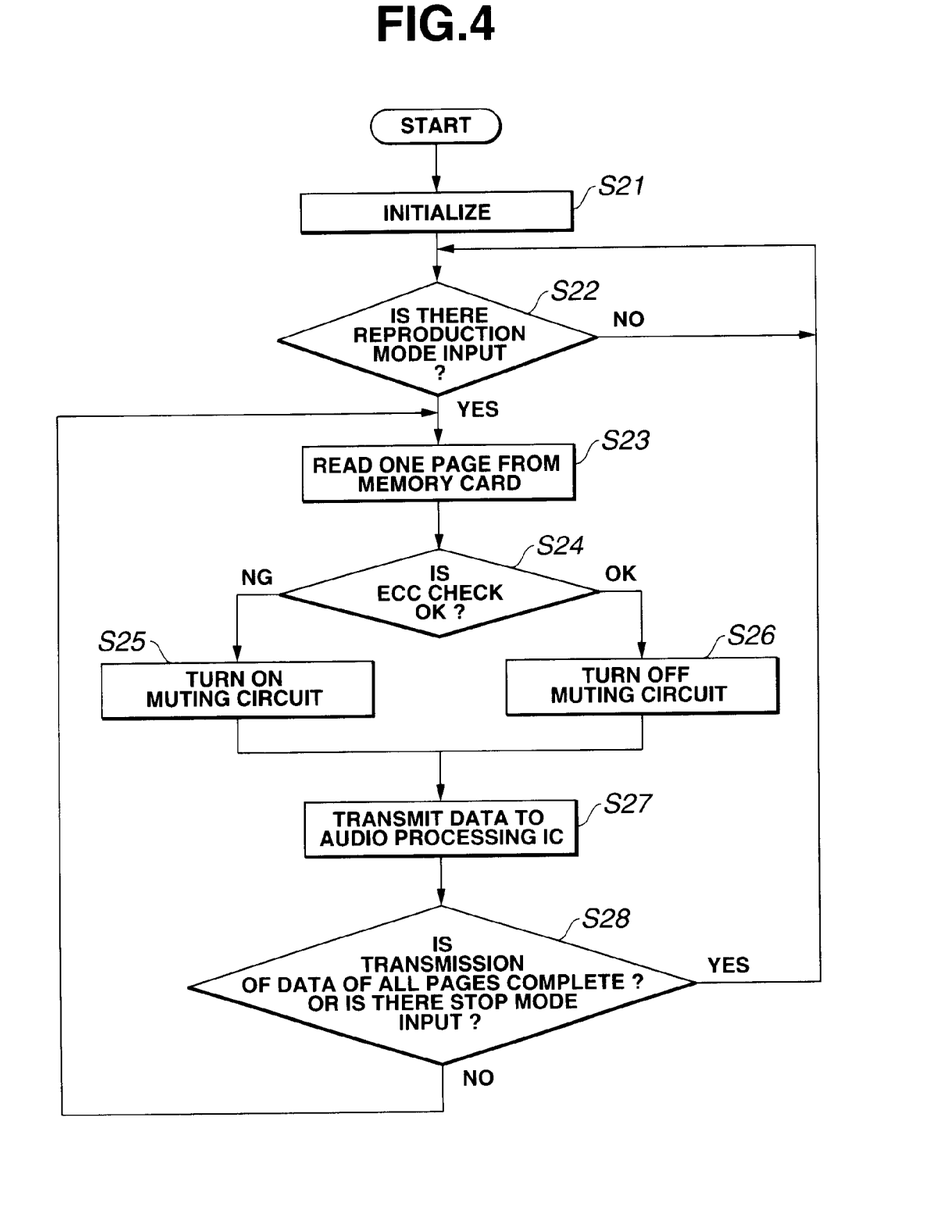
FIG. 4 is a flowchart illustrating the operation of a digital data recording and reproducing apparatus according to yet another embodiment of the invention.

The processing operations of Steps S21 to S24 shown in FIG. 4 are identical to those of Steps S1 to S4 of FIG. 1. If, in Step S24, the decision of "ECC check NG" is made on the digital encoding compressed data read in units of pages of the physical blocks of the non-volatile memory card 25, the process proceeds to Step S25, in which the control means 24A generates a control signal which turns on the operation of the muting circuit 15 and supplies the control signal to the muting circuit 15. In Step S27, the digital encoding compressed data containing the uncorrectable error data of the data area of the page on which the decision of "ECC check NG" has been made in Step S24 is supplied to and decoded and expanded by the decoding expansion circuit 26 of the audio processing IC 31, and the decoded and expanded digital data is converted into an analog signal by the D/A circuit 27. After that, the analog signal is supplied to the speaker 14 via the audio amplifier circuit 13. Step S27 performs the processing similar to Step S6 of FIG. 2, so that the error data is decoded and expanded on "as-is" basis. However, in this case, since the operation of the muting circuit 15 has been turned on in Step S25, the audio signal supplied from the audio amplifier circuit 13 is muted by the muting circuit 15, so that the audio signal is not supplied to the speaker 14 and is not outputted as a reproduced sound.

On the other hand, if, in Step S24, the decision of "ECC check OK" is made, the process proceeds to Step S26, in which the control means 24A supplies a control signal which turns off the operation of the muting circuit 15 to the muting circuit 15. Then, in Step S27, the digital encoding compressed data of the page on which the decision of "ECC check OK" has been made in Step S24 is decoded and expanded by the decoding expansion circuit 26 of the audio processing IC 31, and the decoded and expanded digital data is converted into an analog signal by the D/A circuit 27. The analog signal is outputted from the speaker 14 via the audio amplifier circuit 13 as a reproduced sound having no error. At this time, since the operation of the muting circuit 15 has been turned off in Step S26, the audio signal decoded and expanded by the decoding expansion circuit 26 is outputted as the reproduced sound.

Then, after Step S27 has been completed, the control means 24A, in Step S28, determines whether the reading and the ECC check of all pages have been completed for each of the physical blocks of the file data to be reproduced or an input for setting a stop mode has been received from the operating switch 29. If there is no input for the stop mode or there remain pages, the process returns to Step S23, in which the data of the next page is similarly subjected to an ECC check, and the above-described processing is repeatedly executed in accordance with the decision of the ECC check.

In other words, in the above-described embodiment, a page of a physical block which records digital encoding compressed data containing an error which cannot be corrected by the ECC check with the error correcting data recorded on the same page is decoded and expanded by the decoding expansion circuit 26 and supplied to the audio amplifier circuit 13, but since the operation of the muting circuit 15 is turned on, the digital encoding compressed data of the page of the physical block that contains the uncorrectable data error is not outputted as a reproduced sound. However, the page next to the page containing this uncorrectable data error can be read and error-corrected and hence can be correctly decoded and expanded, whereby reproduction can be performed up to the final page of a file data to be reproduced. In addition, although the page containing the uncorrectable data error is not outputted from the speaker as a reproduced sound, the period of silent time is short, and a user can infer or ignore the contents of the silent state on the basis of reproduced sounds which precede and succeed the muted sound.

As described above, in the invention, if there is data which cannot be corrected with error correcting data, the portion of the uncorrectable data is reproduced in the state of containing the error data, or is skipped, or an output means is muted to disable the outputting of the portion of the uncorrectable data, and a reproduction operation is continued.

Figure 3:
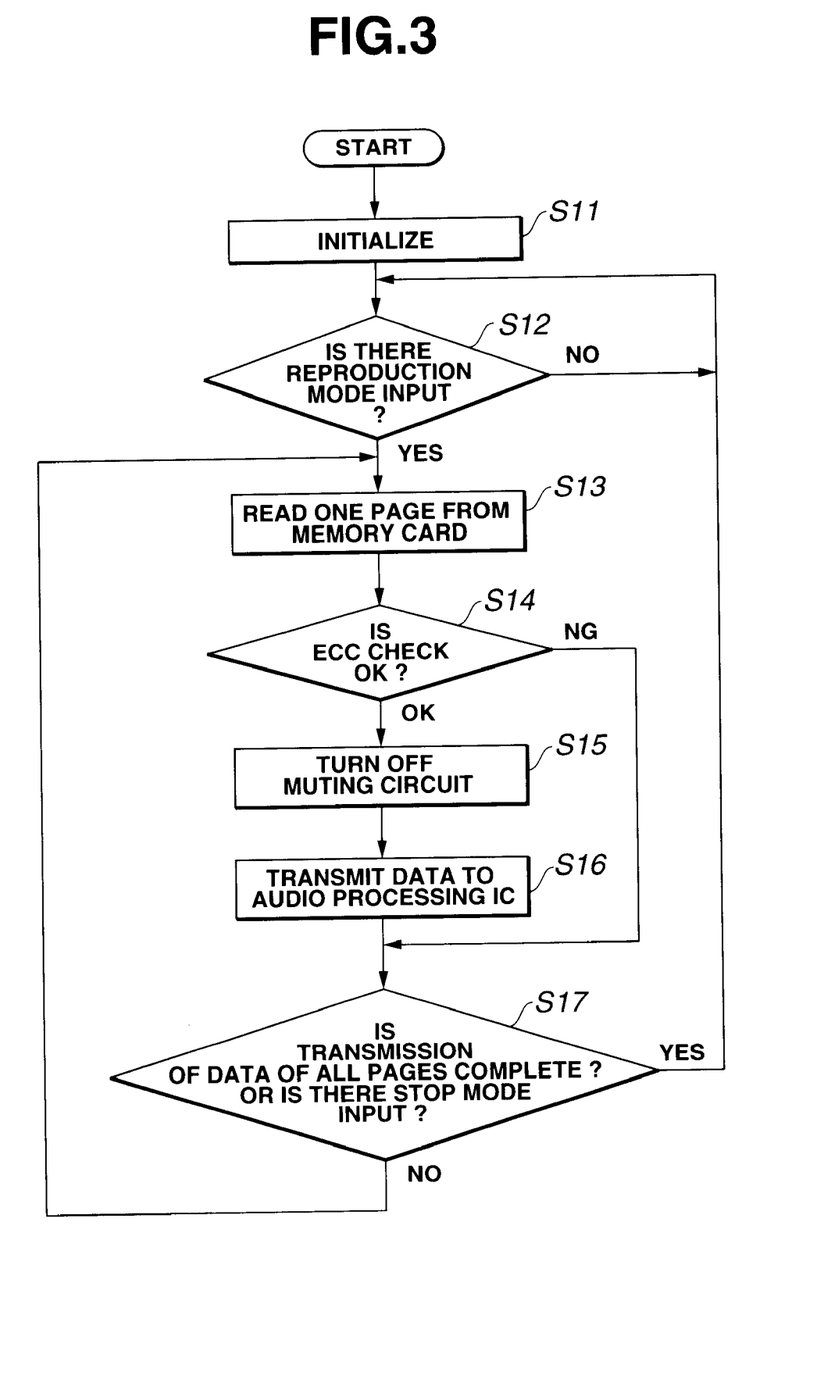
FIG. 3 is a flowchart illustrating the operation of a digital data recording and reproducing apparatus according to another embodiment of the invention.

Incidentally, in either of the flowcharts of FIGS. 2 and 3 which illustrate the operation of the digital decoding control means M2 of the control means 24A of the digital data recording and reproducing apparatus 10 shown in FIG. 1, the operation of the muting circuit 15 is brought to a stop, or the processing is made to proceed irrespective of the operation of the muting circuit 15. Accordingly, even if the muting circuit 15 is removed from the digital data recording and reproducing apparatus 10, the operations shown in FIGS. 2 and 3 can be realized without any problem. If the muting circuit 15 is removed, it is apparent that the digital decoding control means M2 does not need to have the function of generating an operation control signal for the muting circuit 15.

As is apparent from the foregoing description, according to the invention, information which continuously progresses in a time series manner is converted to predetermined digital encoding compressed data and error correcting data for the converted digital encoding compressed data is generated, and both data are recorded on a non-volatile memory card. During reproduction, the data recorded on the non-volatile memory card are read out, and the digital encoding compressed data error-corrected on the basis of the error correcting data is decoded, expanded and reproduced. During the reproduction, even if data which cannot be corrected with the error correcting data is present halfway in the digital encoding compressed data, the portion of the uncorrectable error data is skipped or muted, or the digital encoding compressed data is reproduced in the state of containing the error data. Accordingly, the desired file data can be reproduced from the start to the end thereof, and a user can reproduce and confirm the recorded contents.

As a matter of course, the invention is not limited to only the above-described embodiments and various modifications can be made without departing from the spirit of the invention.

What is claimed is:

1. A digital data recording and reproducing apparatus comprising:

a recording and reproduction control unit for executing exchange of digital encoding compressed data between a digital encoding compression circuit which converts analog information which consecutively progresses in a time series manner into digital encoding compressed data as well as a digital decoding expansion circuit which decodes and expands the digital encoding compressed data and a non-volatile memory in which to record digital encoding compressed data, and recording the digital encoding compressed data in a predetermined area of the non-volatile memory and also reading digital encoding compressed data from the non-volatile memory;

a digital data writing control unit for, during recording of the digital encoding compressed data generated by the digital encoding compression circuit, generating error correcting data for the digital encoding compressed data and also converting the digital encoding compressed data and the error correcting data into a predetermined format of file data, and writing the predetermined format of file data into a predetermined recording area of the non-volatile memory, the digital data writing control unit being provided in the recording and reproduction control unit;

a digital data decoding control unit for, during reproduction of file data recorded on the non-volatile memory, executing control to read the file data, perform error correcting processing on the digital encoding compressed data on the basis of error correcting data contained in the file data, decode and expand by means of the digital decoding expansion circuit the digital encoding compressed data which is regarded as having no error in the error correcting processing or is error-corrected by the error correcting processing, processing of the digital encoding compressed data being skipped without performing the processing of decoding and expanding the digital encoding compressed data if the digital encoding compressed data contains data uncorrectable with the error correcting processing, convert the decoded and expanded digital data into an analog signal, and output the analog signal, the digital data decoding control unit being provided in the recording and reproduction control unit; and an output unit for outputting consecutively in a time series manner the analog signal into which the decoded and expanded digital signal is converted.

2. A digital data recording and reproducing apparatus comprising:

a recording and reproduction control unit for executing exchange of digital encoding compressed data between a digital encoding compression circuit which converts analog information which consecutively progresses in a time series manner into digital encoding compressed data as well as a digital decoding expansion circuit which decodes and expands the digital encoding compressed data and a non-volatile memory in which to record digital encoding compressed data, and recording the digital encoding compressed data in a predetermined area of the non-volatile memory and also reading digital encoding compressed data from the non-volatile memory;

a digital data writing control unit for, during recording of the digital encoding compressed data generated by the digital encoding compression circuit, generating error correcting data for the digital encoding compressed data and also converting the digital encoding compressed data and the error correcting data into a predetermined format of file data, and writing the predetermined format of file data into a predetermined recording area of the non-volatile memory, the digital data writing control unit being provided in the recording and reproduction control unit;

a digital data decoding control unit for, during reproduction of file data recorded on the non-volatile memory, executing control to read the file data, perform error correcting processing on the digital encoding compressed data on the basis of error correcting data contained in the file data, decode and expand by means of the digital decoding expansion circuit the digital encoding compressed data which is regarded as having no error in the error correcting processing or is error-corrected by the error correcting processing, processing of the digital encoding compressed data being skipped without performing the processing of decoding and expanding the digital encoding compressed data if the digital encoding compressed data contains data uncorrectable with the error correcting processing, convert the decoded and expanded digital data into an analog signal, and output the analog signal, the digital data decoding control unit being provided in the recording and reproduction control unit; and an output unit for outputting consecutively in a time series manner the analog signal into which the decoded and expanded digital signal is converted;

wherein the digital data writing control unit generates the digital encoding compressed data and the error correcting data in units of recording pages of a recording area of the non-volatile memory, and converts the digital encoding compressed data and the error correcting data into the predetermined format file data, whereas the digital data decoding control unit executes control to read the file data in units of the recording pages, perform error correction on the digital encoding compressed data on the basis of the generated error correcting data, decode and expand by means of the digital decoding expansion circuit only a page of the digital encoding compressed data which is regarded as having no error in the error correcting processing or is error-corrected by the error correcting processing, the page of the digital encoding compressing data being skipped if the page of the digital encoding compressed data contains data uncorrectable with the error correcting processing, convert the decoded and expanded digital encoding compressed data into an analog signal, and output the analog signal.

* * * * *